United States Patent
Anjum et al.

(10) Patent No.: US 6,331,458 B1
(45) Date of Patent: Dec. 18, 2001

(54) ACTIVE REGION IMPLANT METHODOLOGY USING INDIUM TO ENHANCE SHORT CHANNEL PERFORMANCE OF A SURFACE CHANNEL PMOS DEVICE

(75) Inventors: Mohammed Anjum; Alan L. Stuber; Ibrahim K. Burki, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1236 days.

(21) Appl. No.: 08/532,861

(22) Filed: Sep. 22, 1995

Related U.S. Application Data

(63) Continuation of application No. 08/320,924, filed on Oct. 11, 1994, now abandoned.

(51) Int. Cl.$^7$ ................................................. H01L 21/336
(52) U.S. Cl. .................... 438/197; 438/199; 438/218; 438/225; 438/227; 438/228; 438/229; 438/230; 438/231; 438/232; 438/301; 438/303; 438/305; 438/306; 438/307; 438/217
(58) Field of Search .................................. 437/40, 41, 45, 437/46, DIG. 959, 44; 438/197, 199, 217, 218, 225, 227–232, 301, 303, 305–307

(56) References Cited

U.S. PATENT DOCUMENTS

| | | | | |
|---|---|---|---|---|
| 3,883,372 | * | 5/1975 | Lin | 148/187 |
| 4,530,150 | * | 7/1985 | Shirato | 29/576 B |
| 4,835,112 | | 5/1989 | Pfiester et al. . | |
| 4,851,360 | * | 7/1989 | Haken et al. | 437/29 |
| 4,889,819 | * | 12/1989 | Davari et al. | 437/27 |
| 5,021,851 | | 6/1991 | Haken et al. . | |
| 5,134,447 | * | 7/1992 | Ng et al. | 357/23.4 |
| 5,266,508 | * | 11/1993 | Azuma et al. | 437/41 |
| 5,296,401 | * | 3/1994 | Mitsui et al. | 437/57 |
| 5,320,974 | * | 6/1994 | Hori et al. | 437/44 |
| 5,328,864 | * | 7/1994 | Yoshizumi et al. | 437/57 |
| 5,344,790 | * | 9/1994 | Bryant et al. | 437/44 |

FOREIGN PATENT DOCUMENTS

| | | |
|---|---|---|
| 0 258 148 | 3/1988 | (EP) . |
| 0419128 A1 | 3/1991 | (EP) . |
| 60224271 | 11/1985 | (JP) . |

OTHER PUBLICATIONS

Lin et al., Sub–100–nmp$^+$–n Shallow Junctions Fabricated by Group III Dual Ion Implantation and Rapid Thermal Annealing, Appl. Phys. Lett. 54(18), May 1, 1989, pp. 1790–1792.*

Baker et al., "The Influence of Flourine on Threshold Voltage Instabilities in P+ Polysilicon gated P–Channel MOSFETs", *IEDM*, (1989), pp. 443–446.

Sung et al., "A Comprehensive Study on p+ PolysiliconGate MOSFET's Instability with FLuorine Incorporation", *IEEE*, (1990), pp. 2312–2320.

Ng, et al., "Suppression of Hot–Carrier Degradation in Si MOSFET's by Germanium Doping", *IEEE*, (1990), pp. 45–47.

* cited by examiner

*Primary Examiner*—John F. Niebling
*Assistant Examiner*—Lynne A. Gurley
(74) *Attorney, Agent, or Firm*—Kevin L. Daffer; Conley, Rose & Tayon P.C.

(57) ABSTRACT

An MOS device is provided using indium as a threshold adjust implant in the channel regions of an NMOS device and/or in the conductive gate overlying the channel region in a PMOS device. Indium ions are relatively immobile and achieve location stability in the areas in which they are implanted. They do not readily segregate and diffuse in the lateral directions as well as in directions perpendicular to the silicon substrate. Placement immobility is necessary in order to minimize problems of threshold skew and gate oxide thickness enhancement. Additionally, it is believed that indium atoms within the channel region minimize hot carrier effects and the problems associated therewith.

7 Claims, 4 Drawing Sheets

ACTIVE REGION IMPLANT METHODOLOGY USING INDIUM TO ENHANCE SHORT CHANNEL PERFORMANCE OF A SURFACE CHANNEL PMOS DEVICE

This is a continuation of application Ser. No. 08/320,924 filed Oct. 11, 1994, now abandoned.

BACKGROUND OF THE INVENTION

1. Field of the Invention

This invention relates to the manufacture of an integrated circuit and more particularly to an active area implant which improves MOSFET performance in NMOS and PMOS devices.

2. Description of the Relevant Art

Fabrication of a MOSFET device is well known. Generally speaking, MOSFETs are manufactured by placing an undoped polycrystalline material or "polysilicon" material over a relatively thin gate oxide, and implanting the polysilicon and adjacent source/drain regions with an impurity dopant material. If the impurity dopant material used for forming the source/drain regions is n-type, then the resulting MOSFET is an NMOSFET ("NMOS") device. Conversely, if the source/drain dopant material is p-type, then the resulting MOSFET device is a PMOSFET ("PMOS") device.

The polysilicon and adjacent source/drain regions are formed using well known photolithography techniques. Polysilicon and source/drain regions are patterned in openings formed through a thick layer of what is commonly referred to as "field oxide". The openings are areas in which NMOS and PMOS devices are formed and, since they receive fabricated active devices, are generally called "active regions". The active regions are therefore regions between field oxide and generally include gate oxide, polysilicon over gate oxide and source/drain regions formed within silicon on opposing sides of the polysilicon. Metal interconnect is routed over the thick field oxide to connect with the polysilicon as well as to the source/drain regions to complete the formation of an overall circuit structure.

Many circuits utilize both PMOS and NMOS devices on the same monolithic substrate. While both types of devices can be formed, the devices are distinguished based on the source/drain impurity dopant. The method by which n-type dopant is used to form an NMOS device and p-type dopant is used to form a PMOS device entails unique problems associated with each device. As MOSFET layout densities increase, the problems are exacerbated. Device failure can occur unless adjustments are made to processing parameters and processing steps. NMOS processing must, in many instances, be dissimilar from PMOS processing due to the unique problems of each type of device. Problems inherent in NMOS fabrication will be discussed first followed by PMOS second.

NMOS devices generally suffer from so-called "hot-carrier effects" to a greater degree than PMOS devices. Channel lengths smaller than, for example, 1.5 $\mu$m, make more severe the migration of hot carriers (i.e., electrons) to unwanted areas of the NMOS devices. Hot electrons in NMOS devices are more mobile than counterpart hot holes in PMOS devices making hot carrier effects a predominant problem in NMOS processing.

Hot electrons migrate not only as dimensions shrink in the channel but also as gate oxides become thinner and junctions become shallower. High electric fields allow migrating electrons to gain kinetic energy and become "hot". Each hot electron can (i) cause impact ionization for generating electron-hole pairs in the channel region, and (ii) cause hot electrons to inject primarily from the channel region near the drain and into the overlying gate oxide. Impact ionization can precipitate inadvertent turn-on between the source and drain as the electron-hole pairs become free carriers and flow in opposite direction therebetween. Gate oxide injection can bias the gate oxide causing not only threshold shift but, in the extreme, latchup.

Numerous techniques are used to reduce the problems of hot electron injection in NMOS devices. See, e.g., Ng, et al. "Suppression of Hot-Carrier Degradation in Si MOSFET's by Germanium Doping", *IEEE Electron Dev. Lett.*, Vol. 11, No. 1, (January, 1990). One technique includes a threshold implant adjust within the active region. Threshold adjust generally involves implanting a p-type dopant through the sacrificial oxide or gate oxide and into the underlying channel region. The p-type dopant typically used is boron having an atomic mass of 11 a.m.u. P-type boron thereby acts to increase the threshold of the NMOS device by increasing the concentration of p-type dopant at the surface near the silicon/gate oxide interface. Increase in p-type dopant in the channel in an NMOS device positively skews the threshold and reduces the likelihood of inadvertent turn-on, punch through, and latchup.

Light atomic mass associated with boron, while suitable as a threshold adjust dopant, can present additional problems unique to NMOS devices. For example, because of its low mass, boron has a tendency to segregate and migrate from its implanted position in the channel region to adjacent source/drain regions subsequently doped with heavier n-type ions. For example, if arsenic is used as the source/drain dopant, arsenic will inherently disrupt the lattice structure of the silicon substrate causing bond opportunities within the source/drain regions. The bond opportunities act as a sink for highly mobile, light boron atoms to move from their channel region to the adjacent source/drain regions thereby depleting threshold adjust effectiveness. Boron segregation and diffusion is believed by the present inventors to occur primarily at the edges of the channel, where the channel abuts against the source and drain periphery. A gradient of boron concentration thereby exists across the channel region, resulting from a lowering of threshold adjust dopant at the channel edges. As NMOS channel lengths are reduced, threshold reduction problems are compounded.

In addition to boron segregation and diffusion in lateral directions to adjacent source/drain regions, boron can also diffuse, due to its highly mobile characteristic, in a perpendicular direction to the overlying gate oxide. During subsequent thermal cycles, boron can easily move along interstitial or substitutional locations through the silicon/gate oxide interface. Perpendicular-moving boron is therefore consumed by a growing oxide to not only reduce boron concentration in the channel but, in the converse, is postulated to increase hole concentration in the gate oxide. Hole concentration increase in the gate oxide can attract injected electrons normally arising from hot electron effects. Attraction of hot electrons further compounds the problems of hot electron effects described above.

The deficiencies of boron as a threshold adjust is but one example of recognized problems in NMOS manufacture. Like NMOS, PMOS fabrication also entails numerous problems. The problems generally arise when gate lengths are shortened and are classified or categorized generally as short-channel effects ("SCEs"). To minimize SCEs in PMOS devices, researchers have indicated a need for maintaining the integrity of the channel region vis-a-vis the source/drain region. As taught in U.S. Pat. No. 4,835,112, various barrier dopants are used to retard and substantially prevent diffusion of the source/drain regions into the channel region beyond an initial target amount. Barrier ions such as germanium are typically implanted into the source/drain regions to retard lateral diffusion of the source/drain regions and maintain an effective channel length (Leff) of the PMOS device.

Maintaining integrity of the channel region, its size and dopant concentration, is essential in predicting PMOS operability. During formation of the p-type source/drain regions, p-type dopant is introduced in the self-aligned process across the active region, i.e., across the source/drain regions as well as into the polysilicon material overlying the channel region. If the p-type source/drain implant comprises boron or boron difluoride ($BF_2$), then boron, due to its low atomic mass, has a tendency to migrate through the polysilicon gate material and enter the channel during subsequent anneal. See, e.g., Baker, et al., "The Influence of Fluorine on Threshold Voltage Instabilities in P+ Polysilicon Gated P-Channel MOSFETS," *IEDM* (1989), pp. 443–446. Boron or boron difluoride derivatives causes a change in the concentration level of the channel region. Slight change in channel concentration will cause a shift in the threshold voltage and an unpredictable operation of the PMOS device. Implantation of, for example, boron or boron difluoride into the polysilicon presents numerous problems as described in Sung et al., "Fluorine Effects on Boron Diffusion of P+ Gate Devices," *IEDM,* (1989), pp. 447–450.

Migration of boron from the overlying polysilicon to the channel region is self-evident of possible threshold voltage skews, however, additional problems can occur. For example, if $BF_2$ implants are used to generate the source/drain regions and dope the gate polysilicon, then fluorine from the boron difluoride, being of low atomic mass and therefore highly mobile, generally accumulates at the polysilicon-oxide and oxide-silicon interfaces. As described in Baker, et al., fluorine has a tendency to break the silicon-oxide bonds, freeing oxygen during subsequent thermal cycles. The free oxygen can combine with polysilicon and silicon substrate to cause a thickening of the gate oxide, generally termed as oxide thickness enhancement ("OTE"). OTE not only increases threshold, but may also consume carriers (charged carriers) within the growing oxide which, in extreme, will pre-charge the oxide similar in result to hot carriers injected into the oxide.

Research has been conducted by Mohammed Anjum, co-inventor of the present application, as taught in a commonly assigned, presently pending U.S. Patent Application entitled "Semiconductor Gate Conductor with Impurity Migration Barrier and Method for Producing Same", to minimize or reduce boron and/or fluorine migration from the polysilicon gate conductor to the underlying gate oxide and channel. Placing a barrier implant, such as germanium in the gate material as taught in the aforementioned application, requires precise concentrations and dopant energies to ensure the germanium barrier ions are placed at a deeper depth than the subsequently placed boron or boron difluoride. Thus, germanium barrier ions are implanted in a separate step into only the polysilicon gate prior to polysilicon patterning and source/drain formation. It would be advantageous to eliminate the additional germanium implant step and the precision by which the barrier ions are implanted.

As described throughout the above paragraphs, boron and/or boron difluoride implanted into the active regions of PMOS and NMOS devices present numerous problems in the operation of those devices. As channel lengths shrink, a need arises for eliminating altogether boron and/or boron difluoride as a threshold adjust in NMOS and PMOS and as a gate implant at the surface channel of a PMOS device. It may also be desirable, instead of eliminating boron and/or boron difluoride altogether, to pre-implant a novel p-type barrier ion in both the polysilicon and source/drain regions of the PMOS device prior to normal source/drain, boron or boron difluoride implant.

SUMMARY OF THE INVENTION

The problems outlined above are in large part solved by the improved active area implant methodology of the present invention. That is, active area (i.e., source/drain and overlying gate polysilicon) of an NMOS and/or PMOS device is implanted with a p-type dopant which is not boron or boron difluoride. The p-type dopant is preferably chosen as indium. Indium, having an atomic mass of approximately 114 a.m.u., can be implanted into the channel region of an NMOS device to enhance the threshold of that device while minimizing the possibility of the larger indium atoms segregating and diffusing from their implanted positions. Specifically, the indium atoms have a lesser tendency to segregate and diffuse in a lateral direction toward the source/drain implanted areas. Moreover, indium atoms maintain their position and do not diffuse to a substantial degree to overlying gate oxide. Thus, indium provides a significant advantage over boron as a NMOS threshold adjust implant. By maintaining its relative, "implanted" position, indium can maintain the threshold adjust concentration and will have a lesser tendency to migrate into the gate oxide causing OTE problems. With respect to PMOS processing, indium is used as a single step implant into both the source/drain regions as well as the polysilicon placed between source/drain regions. In the self-aligned implant methodology, indium suffices, in its entirety, as the p-type dopant of the PMOS device. Once implanted into the source/drain regions, indium, substantially maintains its source/drain position necessary to ensure adequate Leff and shallower junction depths. In addition, the larger indium maintains its position within the polysilicon gate structure and does not, to a substantial degree, diffuse to underlying gate oxide and channel regions—a problem described above in relation to boron or boron difluoride within the polysilicon gate.

As described in relation to PMOS processing, indium serves as the p-type dopant of the source/drain regions in lieu of conventional boron or boron difluoride. Alternatively, if desired, boron or boron difluoride can be implanted after indium is implanted in the active regions so as to provide a more uniform gate doping and less channeling due to pre-amorphization. While not necessary for the present invention, boron can be used as an impurity source for the source/drain regions provided the boron is implanted after indium implantation. Indium serves as a barrier in the polysilicon material by stuffing grain boundary locations. Therefore, while indium is preferred as the only dopant within the PMOS active regions, boron can still be used provided it is implanted after indium, and indium is implanted at a peak concentration density depth deeper than boron.

An important advantage of indium is its larger atomic mass and the characteristic by which its implanted position is maintained. That is, indium implanted position is maintained within the active region, which includes the source/drain regions, the channel region (i.e., threshold adjust area), and the polysilicon gate region. Additionally, and of further importance, is the relative ease by which indium can be implanted at a controlled, shallower distance within the target material. Modern ion implanters generally operate at higher energy levels and at higher current necessary to increase dopant concentration and throughput of a wafer implantation step. Higher energies generally involve implanting at a deeper depth when lighter atomic source material is used. Thus, if boron is the source chosen, boron, being of lighter atomic mass, will typically be placed at a deeper depth than heavier boron difluoride or indium for a given implant energy. Indium, being of greater atomic mass than boron or boron difluoride can be placed, therefore, at a shallower location with the target assuming a constant, relatively high implant energy. As channel lengths decrease, so must the junction depths and threshold adjust depths of the implanted species. It is therefore of significant importance that a larger atomic mass, heavier ion source be chosen not only for the target source/drains but also for any target within the active regions.

Broadly speaking, the present invention contemplates a method for fabricating an integrated circuit. The method can be used to form a PMOS, an NMOS or a combination of PMOS and NMOS (i.e., CMOS) devices upon a single monolithic substrate. The method includes the steps of providing an opening to an active region of a semiconductor substrate upper surface. Indium ions can then be implanted through the opening and into the active regions, whereby a polysilicon gate material can then be deposited upon the active region to complete a threshold adjust implant of an NMOS device. Additionally, indium can be implanted through the opening into a conductive gate as well as source and drain regions configured within the active region to complete the source/drain implant as well as polysilicon implant of a PMOS device.

In threshold adjust implant of an NMOS device, indium ions are preferably injected to a concentration peak density at a first depth relative to the semiconductor substrate upper surface. An insulating layer, preferably a silicon dioxide in the gate region, is grown upon and into the silicon substrate active region to a depth limited by the first depth. The implanted indium ions can be injected either before or after the gate insulator is formed. If injected before gate insulator formation, then indium can be used as a growth-stop barrier of gate insulator (oxide) grown into the underlying silicon. Indium can therefore be used to closely control gate oxide growth and prevent unwanted continued growth during subsequent anneal cycles.

Implanted indium in the channel region, sufficing as a threshold adjust of an NMOS device, not only controls subsequent growth of gate oxide, but also controls lateral diffusion and intermingling or bonding between channel-region indium and source/drain region n-type implanted ions. N-type ions are generally large arsenic ions similar to the large indium ions and therefore do not easily migrate from their implanted positions. Leff is therefore maintained. Further, channel-implanted indium helps minimize problems of hot-electron effects arising from the drain region to either the source, substrate or gate oxide as described below in reference to the drawings.

With respect to a PMOS device, indium suffices not only as the source/drain dopant, but also as large, substantially immobile dopants within polysilicon overlying the PMOS channel region. Somewhat immobile indium ions do not easily migrate from the polysilicon target areas to underlying channel regions and therefore do not cause OTE problems or threshold skews normally associated with conventional boron or boron difluoride implants. Indium is therefore used in the fabrication process for reducing diffusion of p-type dopant (either indium or a combination of indium and boron) from a patterned semiconductor gate conductor to the underlying channel region, or from source/drain regions to the adjacent channel region.

BRIEF DESCRIPTION OF THE DRAWINGS

Other objects and advantages of the invention will become apparent upon reading the following detailed description and upon reference to the accompanying drawings in which.

Figure 1:
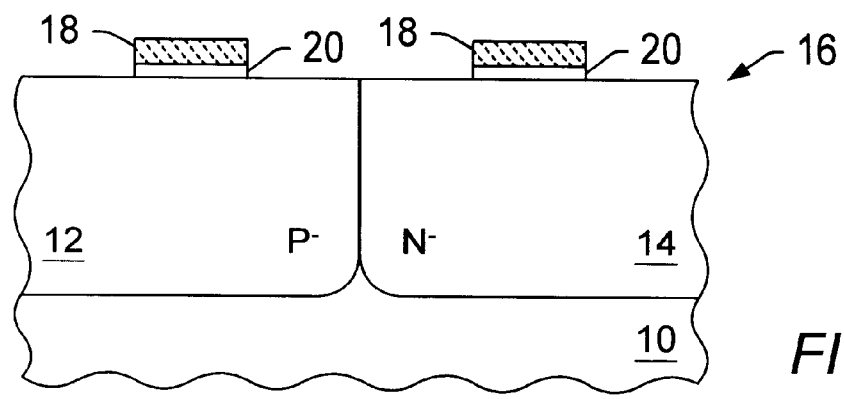
FIG. 1 is a cross-sectional view of a partial semiconductor substrate prepared for local oxidation of silicon (LOCOS) process.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a partial semiconductor substrate 10 suitable for producing a PMOS and/or NMOS device according to the present invention. Substrate 10 is preferably a silicon-based, single crystalline structure. One surface of substrate 10 embodies a p-well 12 and/or an n-well 14. P-well 12 is formed (through diffusion or implantation) using p-type impurities, whereas n-well 14 is formed (through diffusion or implantation) using n-type impurities.

FIG. 1 illustrates one step in the local oxidation of silicon ("LOCOS"). LOCOS is necessary for dielectric isolation of active regions formed on upper surface 16 of substrate 10. LOCOS begins by, for example, depositing or growing an insulating layer, preferably oxide, across the entire upper surface 16. Deposited upon the oxide layer is a layer which is impervious to oxygen diffusion and is therefore used as a mask against oxidation. A suitable oxygen-impervious material includes silicon nitride. Once silicon nitride is deposited over the oxide, a mask is used to expose and selectively etch away a portion of both the silicon nitride and underlying oxide to present a patterned structure of oxygen impervious material 18 underlying pad oxide 20. If p-well 12 and n-well 14 are formed on the same monolithic substrate 10, then patterned silicon nitride 18 and pad oxide 20 are formed over active regions at upper surface 16 of each well. As defined herein "active regions" are those regions which receive a polysilicon gate conductor and source/drain implants as described herein below. Active regions are therefore those regions formed between field oxides described in reference to FIG. 2.

Figure 2:
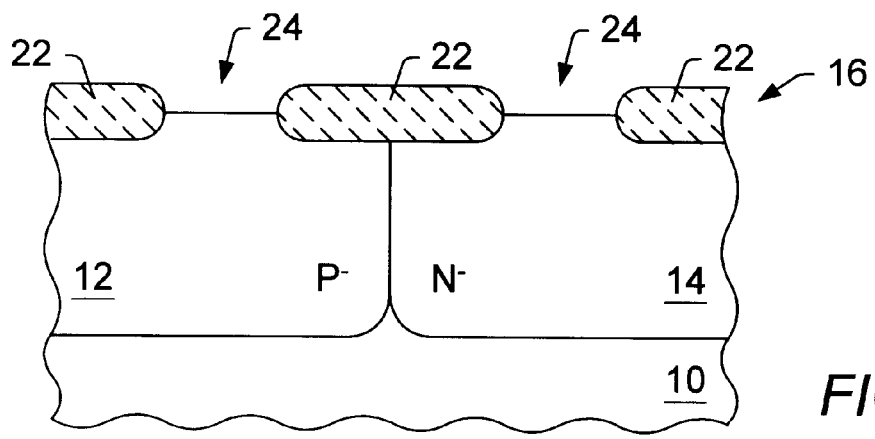
FIG. 2 is a cross-sectional view of the semiconductor substrate having localized field oxides formed according to the LOCOS process.

FIG. 2 illustrates, in a step subsequent to that of FIG. 1, thermal growth of an insulating layer, generally silicon dioxide 22 in areas void of silicon nitride 18. Oxide 22 is relatively thick and, as termed in the conventional sense is "field oxide", is generally several thousand angstroms in thickness and separates active regions 24 formed between field oxide 22. Active regions 24 exist as a result of removing both silicon nitride 18 and pad oxide 20 after field oxide 22 is grown. Removal of silicon nitride 18 and pad oxide 20 leaves an exposed upper surface 16 only in the active regions. Exposed active regions 24 can therefore receive implanted ions and deposited/grown thin films brought about by subsequent steps shown in FIGS. 3 through 6B.

Figure 3:
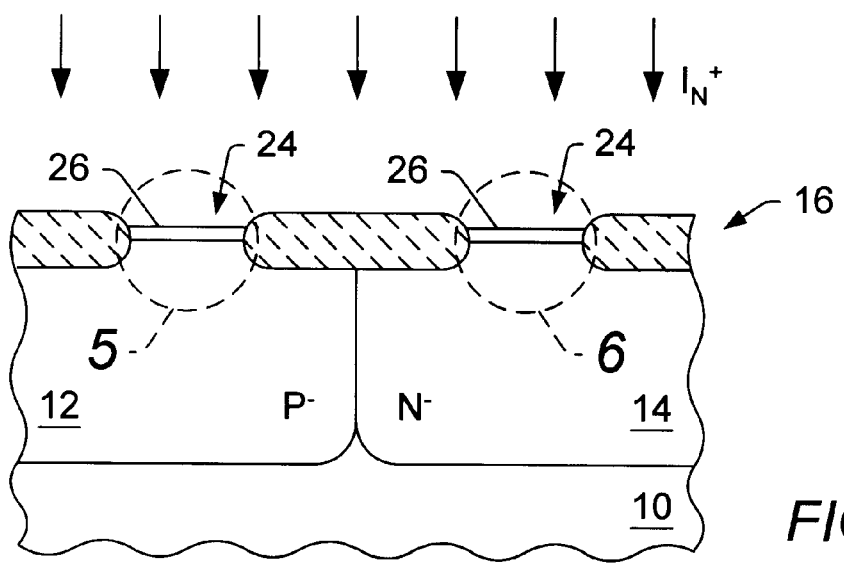
FIG. 3 is a cross-sectional view of the semiconductor substrate undergoing indium implant into a channel region according to the present invention.

Turning now to FIG. 3, a step subsequent to that of FIG. 2 is shown in which indium is implanted into active regions 24. FIG. 3 illustrates exemplary indium implantation into both p-well 12 and n-well 14 active regions. However, it is understood by a skilled artisan that photoresist can be used and placed over n-well to achieve indium implantation only within p-well 12. The same can be true in the converse. Indium implant can be advantageously inserted into the bare upper surface 16 of substrate 10 or through a gate oxide formed in a step prior to indium implant. Thus, indium implant of FIG. 3 is used to adjust the thresholds of devices formed with in active regions 24, wherein area 26 comprises a shallow indium implant or a gate oxide adapted to receive an indium implant.

Indium is implanted using an ion implant device which ionizes elemental indium and accelerates the indium ions at an exemplary dose within the range of $1\times10^{12}$ atoms /cm$^2$ to $1\times10^{13}$ atoms /cm$^2$. Advantageously, the ion implant device can operate at high energies since indium, of atomic mass 114 a.m.u. is quite heavy. As an example, implant energies can exist at levels greater than 220 keV to place indium at a thickness less than 0.103 microns below upper surface 16. Modern ion implanters can thereby present indium as a more suitable implant source material than lighter ions. A shallow threshold adjust in active regions 24 is necessary when channel lengths are quite small, and preferably in the range of three microns or less.

Indium implant in active region 26 of p-well 12 will increase the thresholds of the ensuing NMOS device. Conversely, indium implant in active region 26 of n-well 14 will decrease the threshold of the ensuing PMOS device.

Figure 4:
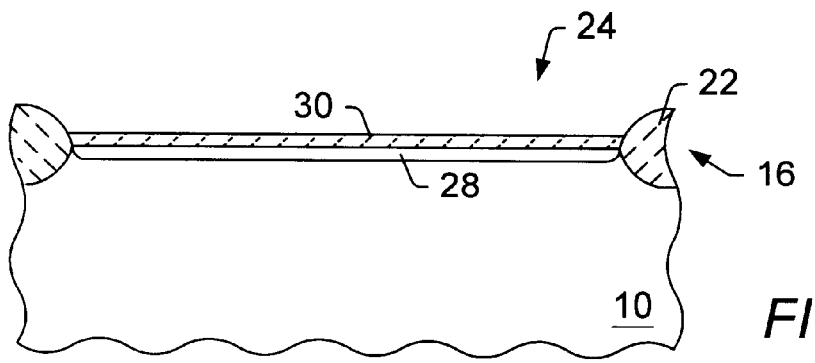
FIG. 4 is a cross-sectional view along area 5 or 6 of FIG. 4 showing a semiconductor substrate active region having an indium implant region formed within the channel region beneath a gate oxide according to the present invention.

Referring to FIG. 4, the active region 24 of areas 5 or 6 is shown. In particular, FIG. 4 aids in describing the formation of area 26. Area 26 includes indium implant 28 beneath gate oxide 30. Indium region 28 is formed either before gate oxide 30 is is grown. Indium region 28 therefore achieves a gate oxide stop at a controlled distance below the upper surface 16 of substrate 10. It is postulated that oxygen atoms of gate oxide 30 bond with silicon atoms at upper surface 16. If silicon atoms are bonded with a predominate amount of indium atoms, then there remains insufficient number of bond locations in which oxygen can occupy thereby limiting the downward growth of oxide 30. Indium implant region 28 therefore suffices as a mechanism for closely controlling the thickness of gate oxide 30—an advantageous outcome for achieving close control of device threshold and speed operability.

Figure 5:
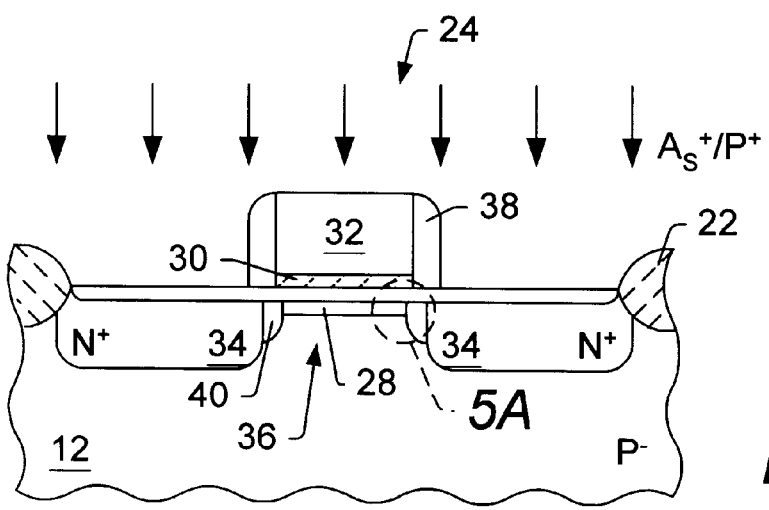
FIG. 5 is a cross-sectional view along area 5 of FIG. 3 showing an active region of an NMOS device undergoing source/drain arsenic or phosphorous implant at a step subsequent to that shown in FIG. 3.

Referring to FIG. 5, a cross-sectional view along area 5 of FIG. 3 is shown at a process step subsequent to that of FIG. 3. Specifically, FIG. 5 illustrates an active region 24 within p-well 12 having conductive gate 32 interposed between source/drain regions 34. Source/drain regions 34 are implanted using the self-aligned process with n-type ions, either arsenic (As) or phosphorous (P).

Source/drain implantation of FIG. 5 occurs at a step subsequent to that of FIG. 3, wherein indium ions are pre-disposed within active region 24 and, specifically, within channel area 36 underlying conductive gate 32 and gate oxide 30. Indium implant region 28 is therefore formed within channel region 36, between source/drain regions 34. The NMOS structure of FIG. 5 is formed using the lightly doped drain ("LDD") process having sidewall spacers 38 and lightly doped regions 40, as shown. It is not necessary, however, that LDD be used to carry forth the present invention. LDD is used purely for exemplary purposes indicative of its applicability to short channel length devices.

Figure 5A:
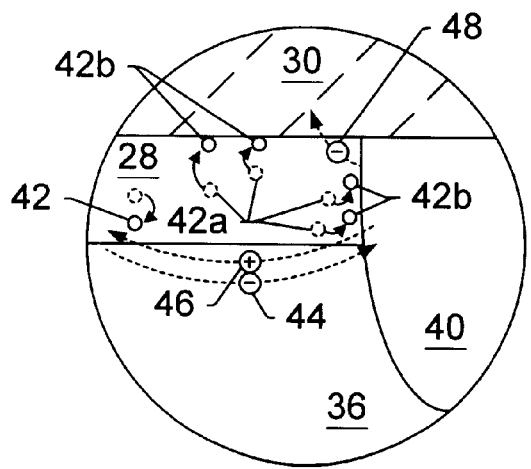
FIG. 5A is a detailed view along area 5A of FIG. 5 showing advantages at an atomic level of indium implant within the channel region.

Referring to FIG. 5A, a detailed view along area 5A of FIG. 5 is provided and shown at an atomic level. FIG. 5A illustrates the threshold adjust indium implant region 28 having indium atoms 42 placed therein. Indium atoms 42 maintain their implanted position despite subsequent high temperature thermal cycles inherent in semiconductor fabrication. Indium atoms 42, due to their large atomic mass, have difficulty moving through the silicon lattice to adjacent (lateral or overlying) positions. For example, FIG. 5A illustrates indium atom 42a moving only slightly toward adjacent lightly doped source/drain regions 40, as indicated by destination location 42b. Likewise, implanted indium atoms 42a near the lower surface of gate oxide 30 move only slightly toward gate oxide 30 to destination location 42b. Relative attachment at the implant position prevents problems of OTE as well problems of segregation and lateral diffusion described above. Any OTE or lateral diffusion can limit the effectiveness of the threshold adjust by lowering the threshold value.

FIG. 5A further describes the advantages of indium implant as a deterrent against hot carrier effects. Specifically, the large atomic mass and size of indium limits impact ionization of electrons which become hot near the drain edge of channel 36 and which move through the channel to the source, as shown by the phantom lines 44. The electrons lose energy via impact ionization causing holes to move in the reverse direction as shown by reference numeral 46. The electron-hole pairs can lead to avalanche breakdown as well as other problems normally associated with hot carrier or hot electron effects. Due to the large atomic mass of indium, electrons swept from the drain cannot easily impact with smaller atomic units within the channel to cause dislodgement of holes traveling in the reverse direction. It is postulated that, as a result of larger indium atoms, carriers in the channel cannot obtain sufficient energy to be termed "hot" carriers since they are scattered by the larger indium atoms. Scattering lowers the carrier energy thereby reducing ho t carrier (or hot electron) effects normally associated with NMCS devices. In addition, larger indium atoms minimizes injection of electrons (shown by reference numeral 48) into gate oxide 30 from a drain region 40. Minimization of hot carrier injection into gate oxide or resulting in impact ionization helps minimize or reduce the problems of hot carrier effects.

Figure 5B:
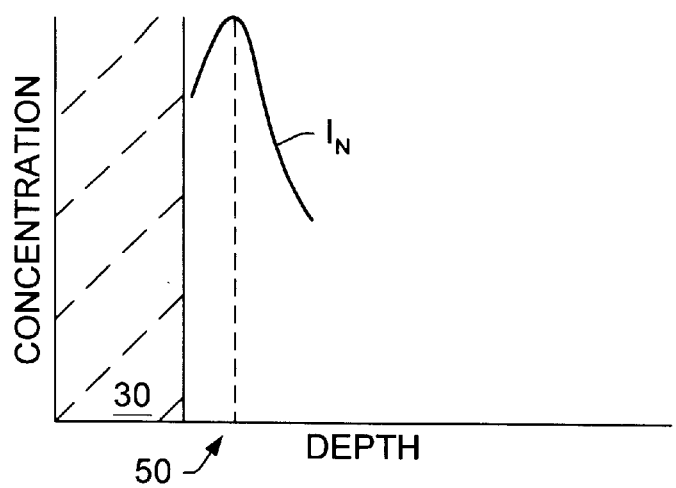
FIG. 5B is a graph of concentration density versus depth of indium implant into the channel region of FIG. 3 according to the present invention.

Referring to FIG. 5B, a graph of concentration density versus depth of indium implant into channel region 36 is shown. Target indium implant is to a concentration peak density at a depth just below the lower surface of gate oxide 30. Concentration peak density is shown at a depth referenced as numeral 50. Depth 50 is chosen to limit downward growth and consumption of silicon by oxygen within gate oxide 30. Preferably, concentration peak density depth 50 is less than 1030 angstroms beneath upper surface 16 of substrate 10 or beneath the initial lower surface of gate oxide 30, depending upon the relative order of gate oxide growth with respect of indium implant.

Figure 6:
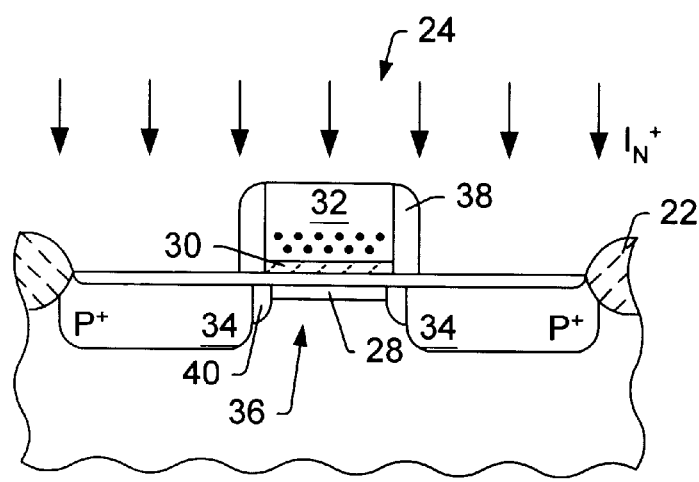
FIG. 6 is a cross-sectional view along area 6 of FIG. 3 showing the semiconductor substrate active region of a PMOS device undergoing source/drain indium implant at a step subsequent to, or in lieu of, the implant shown in FIG. 3.

Turning now to FIG. 6, a cross-sectional view along area 6 of FIG. 3 is shown at a step subsequent to that of FIG. 3. Specifically, FIG. 6 illustrates active region 24 of a PMOS device undergoing source/drain indium implant. Indium is implanted not only in source/drain regions 34 to form the p-type impurity therein, but also to a specified depth relative to the upper surface of conductive gate 32. Implantation within conductive gate 32 as well as source/drain regions 34 advantageously occurs during a single implant step without requiring a mask or additional photolithography steps. Indium within conductive gate 32 remains substantially within material 32 and, unlike counterpart boron or $BF_2$ implants, does not migrate entirely through material 32 and into underlying oxide 30 as well as channel 36. Avoiding boron and the problems of fluorine and $BF_2$ allows indium, once placed, to remain within conductive gate 32 as p+ polysilicon gate material necessary for enhanced surface channel capabilities of modern PMOS devices. Avoidance of through-migration to underlying oxide 30 and channel 36 prevents negative threshold skews and the problems resulting from such skews whenever short channel lengths are presented.

Figure 6A:
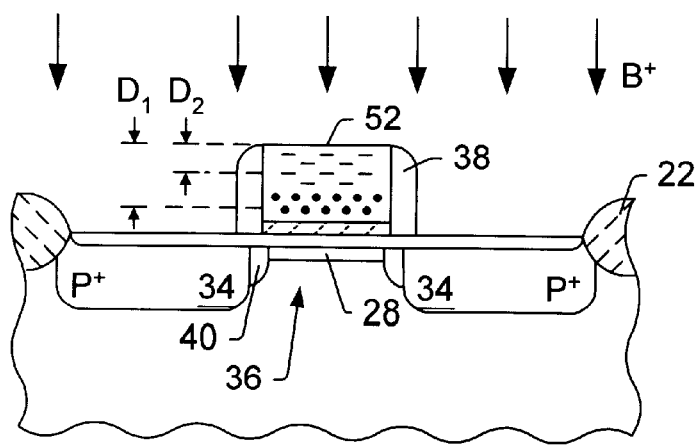
FIG. 6A is a cross-sectional view along area 6 of FIG. 3 showing the semiconductor substrate active region of a PMOS device, in an alternative embodiment undergoing source/drain boron implant at a step subsequent to that shown in FIG. 6.

By using indium as the source/drain implant instead of boron or boron difluoride allows a more controlled, shallower implant at the source/drains when using high energy implant devices. Once indium implant is achieved, as shown in FIG. 6, subsequent metallization can be coupled to the source/drain junctions to complete the circuit interconnect structure without requiring boron or boron-derivatives. Alternatively, in accordance with another exemplary embodiment, boron or boron-derivatives can be implanted after indium is implanted in accordance with the process steps shown in FIG. 6A. FIG. 6A is a cross-sectional view along area 6 of FIG. 3, in accordance with an alternative embodiment, at a step subsequent to that shown in FIG. 6. Thus, instead of ending the implant at the step of FIG. 6 according to a preferred embodiment, a subsequent implant, using boron, can be utilized as shown in FIG. 6A. Boron can be implanted in accordance with FIG. 6A with minimal risk of through-diffusion from conductive gate 32 to underlying gate oxide 30 and channel region 36 since indium was previously placed at a peak concentration density depth $D_1$ deeper than the subsequent boron peak concentration density depth $D_2$. Depths $D_1$ and $D_2$ are measured relative to upper surface 52 of conductive gate 32. By controlling the implant energies of indium and boron, indium can be implanted at a depth deeper than subsequent boron to provide a barrier against boron segregation and diffusion from conductive gate 32 through the indium and to underlying gate oxide 30 and channel region 36. It is appreciated that boron need not be used as the source/drain implant material, however, if it is used, it is used after indium implant. The larger indium atoms sufficiently "stuff" grain boundary locations as well as the grains themselves of polycrystalline silicon conductive gate 32 and prevent interstitial and substitutional movements of overlying boron through the grain locations to underlying active regions. Providing a barrier against through-diffusion achieves the advantages of maintaining tight threshold control in the channel as well as preventing OTE problems.

Figure 6B:
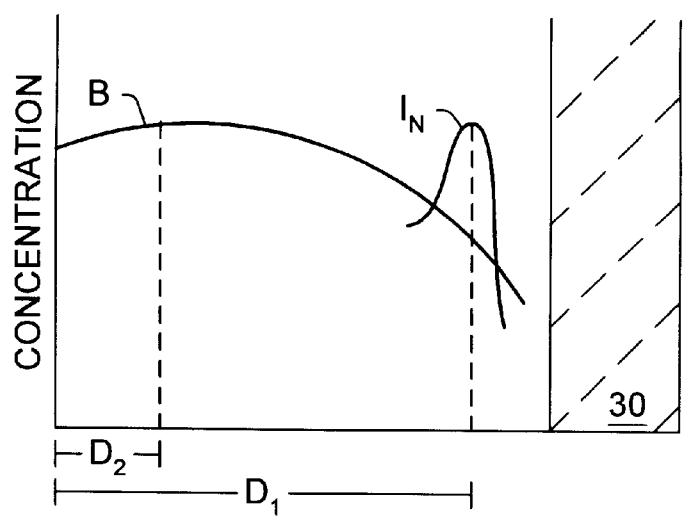
FIG. 6B is a graph of concentration density versus depth of indium and boron implant into a conductive gate of FIGS. 6 and 6B according to the present invention.

Referring now to FIG. 6B, a graph of concentration density versus depth of indium and boron according to the embodiment of FIG. 6A is shown. The graph of FIG. 6B illustrates various concentration densities of implanted p-type ions (indium and boron) into conductive gate 32 and above gate oxide 30. Indium ions are shown implanted at a concentration peak density at a first depth above gate oxide 30 as well as channel region 36. P-type ions, such as boron ions, are implanted into the conductive gate in a subsequent step, shown in FIG. 6A, to a concentration peak density at a second depth shallower than the first depth. The first depth is indicated as $D_1$ and the second depth is indicated at $D_2$. Indium species can be implanted to a depth sufficient to prevent what is commonly referred to as the "depletion effect". After thermal cycles, indium atoms extend substantially across the polysilicon profile to minimize unwanted gate capacitance attributed to active boron or unwanted impurities subsequently placed in the polysilicon.

It will be appreciated to those skilled in the art having the benefit of this disclosure that this invention is believed to be capable of MOS applications (NMOS and/or PMOS) which utilize p-type implant into the channel regions as a threshold adjust or into conductive gate regions as part of the source/drain implant. It is also to be understood that the form of the invention shown and described is to be taken as presently preferred embodiments. Various modifications and changes may be made without departing from the spirit and scope of the invention as set forth in the claims. For example, modifications can be made to each and every processing step as would be obvious to a person skilled in the art having benefit of this disclosure, provided the modifications achieve the results set forth in the claims. It is therefore intended that the following claims be interpreted to embrace all such modifications and changes.

What is claimed is:

1. A method for fabricating an integrated circuit, comprising:

providing an opening to an active region of a semiconductor substrate upper surface;

constructing a conductive gate across a portion of said active region; and implanting only indium ions through said opening into said active region, wherein said implanting forms p-type source and drain regions within said active region simultaneously with indium within said conductive gate.

2. The method as recited in claim 1, wherein said providing step comprises:

growing a pad oxide upon said semiconductor substrate upper surface;

depositing silicon nitride upon said pad oxide;

selectively removing a portion of said silicon nitride and said pad oxide to expose a field region of said semiconductor substrate upper surface;

forming an insulation material upon the exposed field region of said semiconductor substrate; and removing the remaining said silicon nitride and said pad oxide overlying said active region to produce said opening through said insulation material.

3. The method as recited in claim 2, wherein said forming step comprises growing the insulation material consisting essentially of silicon dioxide upon the semiconductor substrate consisting essentially of silicon.

4. The method as recited in claim 1, wherein said constructing step comprises:

depositing a layer of polysilicon across the entire said active region, wherein said active region comprises a channel region interposed between said source region and said drain region; and removing a portion of said polysilicon overlying said source and drain regions to expose said source and drain regions while leaving in place said polysilicon overlying said channel region.

5. The method as recited in claim 4, wherein said implanting step comprises injecting indium ions into said conductive gate to a concentration peak density at a depth above said channel region.

6. The method as recited in claim 4, wherein said implanting step comprises injecting indium ions into said source and drain regions to a concentration peak density at a depth less than 1.0 $\mu$m.

7. The method as recited in claim 1, wherein said implanting step comprises:

ionizing elemental indium; and accelerating the indium ions at a dose within the range of $1 \times 10^{15}$ atoms/cm$^2$ to $1 \times 10^{16}$ atoms/cm$^2$, and at an implant energy greater than 110 keV.

* * * * *